United States Patent
Huang et al.

(10) Patent No.: US 6,822,864 B2
(45) Date of Patent: Nov. 23, 2004

(54) HEAT-DISSIPATING ASSEMBLY AND SECURING DEVICE USED THEREIN

(75) Inventors: Wen-shi Huang, Taoyan County (TW); Kuo-cheng Lin, Taoyan (TW); Fu-hau Tsai, Taoyuan County (TW); Yu-hung Huang, Taoyan County (TW)

(73) Assignee: Delta Electronics, Inc., Taiwan (TW)

( * ) Notice: Subject to any disclaimer, the term of this patent is extended or adjusted under 35 U.S.C. 154(b) by 49 days.

(21) Appl. No.: 10/310,510

(22) Filed: Dec. 4, 2002

(65) Prior Publication Data

US 2003/0142478 A1 Jul. 31, 2003

(30) Foreign Application Priority Data

Jan. 31, 2002 (TW) .................................. 91201080 U

(51) Int. Cl.⁷ .............................................. H05K 7/20
(52) U.S. Cl. ........................... 361/697; 24/457; 24/458; 248/505; 248/510; 257/719; 361/704; 361/710
(58) Field of Search ........................... 24/453, 457–458; 248/505, 510; 165/80.2, 80.3, 121, 122, 126, 185; 257/706–707, 712–713, 718–719, 722, 726–727; 361/687, 694–697, 703, 710, 719–720

(56) References Cited

U.S. PATENT DOCUMENTS

| | | | | |
|---|---|---|---|---|
| 5,943,209 A | * | 8/1999 | Liu ............................. | 361/695 |
| 6,336,499 B1 | * | 1/2002 | Liu ............................ | 165/80.3 |
| 6,430,051 B1 | * | 8/2002 | Yang et al. ................ | 361/704 |
| 6,450,248 B1 | * | 9/2002 | Chang ....................... | 165/80.3 |
| 6,480,384 B2 | * | 11/2002 | Lo ............................. | 361/704 |

* cited by examiner

*Primary Examiner*—Gregory D Thompson
(74) *Attorney, Agent, or Firm*—Martine & Penilla, LLP

(57) ABSTRACT

The invention provides a heat-dissipating assembly and a securing device used therein, which utilizes a way of securing by applying force in one direction to prevent the surface of a chip from being damaged. The securing device includes a frame body having a plurality of first fasteners fastened to a socket by the first fasteners; and a wrenching member pivotally coupled to the frame body, wherein after applying an external force on the wrenching member in one direction, the heat-dissipating device can be fixed tightly on the socket.

18 Claims, 5 Drawing Sheets

HEAT-DISSIPATING ASSEMBLY AND SECURING DEVICE USED THEREIN

BACKGROUND OF THE INVENTION

1. Field of the Invention

The invention relates to a heat-dissipating assembly and a securing device used therein and, more particularly, to a securing device where a heat-dissipating device is mounted on a CPU socket in order to simplify the assembling process, and to prevent the CPU from being damaged due to an uneven applied force when assembling.

2. Description of the Related Art

Referring to FIGS. 1A and 1B, a heat-dissipating assembly for a conventional central processing unit (CPU) of a personal computer is shown. When assembling, each of the two retaining holes 111 at both ends of the U-shaped clip 11 is fastened to each of the two hooks 121 at both sides of the CPU base 12, while the heat sink 13 and the CPU are mounted on the CPU base 12. The U-shaped clip 11 spans across and applies a downward force on the heat sink 13, making the heat sink 13 closely contact the CPU and fixing the CPU on the CPU base 12. However, the resilience of the U-shaped clip 11 will be decreased along with the frequent use of the U-shaped clip 11; therefore, it is quite impossible to fix the heat sink 13 tightly. Besides, when assembling, one retaining hole at one end of the U-shaped clip 11 must be fastened to one hook of the CPU base 12 in advance, and the same job must be done for the other retaining hole to the other hook. Consequently, one end of the U-shaped clip 11 has to take a larger force when finishing the fastening job, making the surface of the CPU damaged due to an uneven external force applied on it.

Therefore, in view of the shortcoming of the conventional technique, the invention provides a heat-dissipating assembly and a securing device used therein to solve the above-mentioned problems.

SUMMARY OF THE INVENTION

An object of the invention is to provide a heat-dissipating assembly and a securing device used therein which can secure a heat-dissipating device on a chip or on its corresponding mounting seat without additional tools.

Another object of the invention is to provide a heat-dissipating assembly and a securing device used therein, which utilizes a way of securing by applying force in one direction to prevent the surface of a chip from being damaged.

According to an aspect of the invention, the securing device includes a frame body having a plurality of first fasteners, the frame body is fastened to a socket by the first fasteners; and a wrenching member, which is pivotally coupled to the frame body, wherein when applying an external force on the wrenching member in one direction, the heat-dissipating device can be fixed tightly on the socket.

Preferably, each of the first fasteners of the frame body is an L-shaped engaging hook, which can be engaged with an inverted hook on the socket. Or, each of the first fasteners of the frame body has a retaining hole, which can be engaged with an inverted hook on the socket.

Preferably, the plurality of first fasteners is integrally formed with the frame body, and both can be made of plastic or metal.

In addition, the wrenching member includes a pivoting portion, which is engaged with the frame body for being a fulcrum when applying an external force on the wrenching member; and a link, which is linked to the pivoting portion. Preferably, the link is integrally formed with the pivoting portion, and both can be made of plastic or metal. The pivoting portion is engaged with the frame body at one side of or in the center of the frame body. Moreover, the frame body includes an opening for accommodating the heat-dissipating device. The side view of the frame body shows a substantially M-shaped structure or a substantially inverted-U-shaped structure. Furthermore, the frame body further includes a plurality of second fasteners can be fastened to the wrenching member after applying an external force on the wrenching member in one direction, wherein each of the second fasteners is an inverted-L-shaped engaging hook.

The invention will be better understood through the following detailed description with reference to the drawings.

DESCRIPTION OF THE PREFERRED EMBODIMENT

Figure 1A:
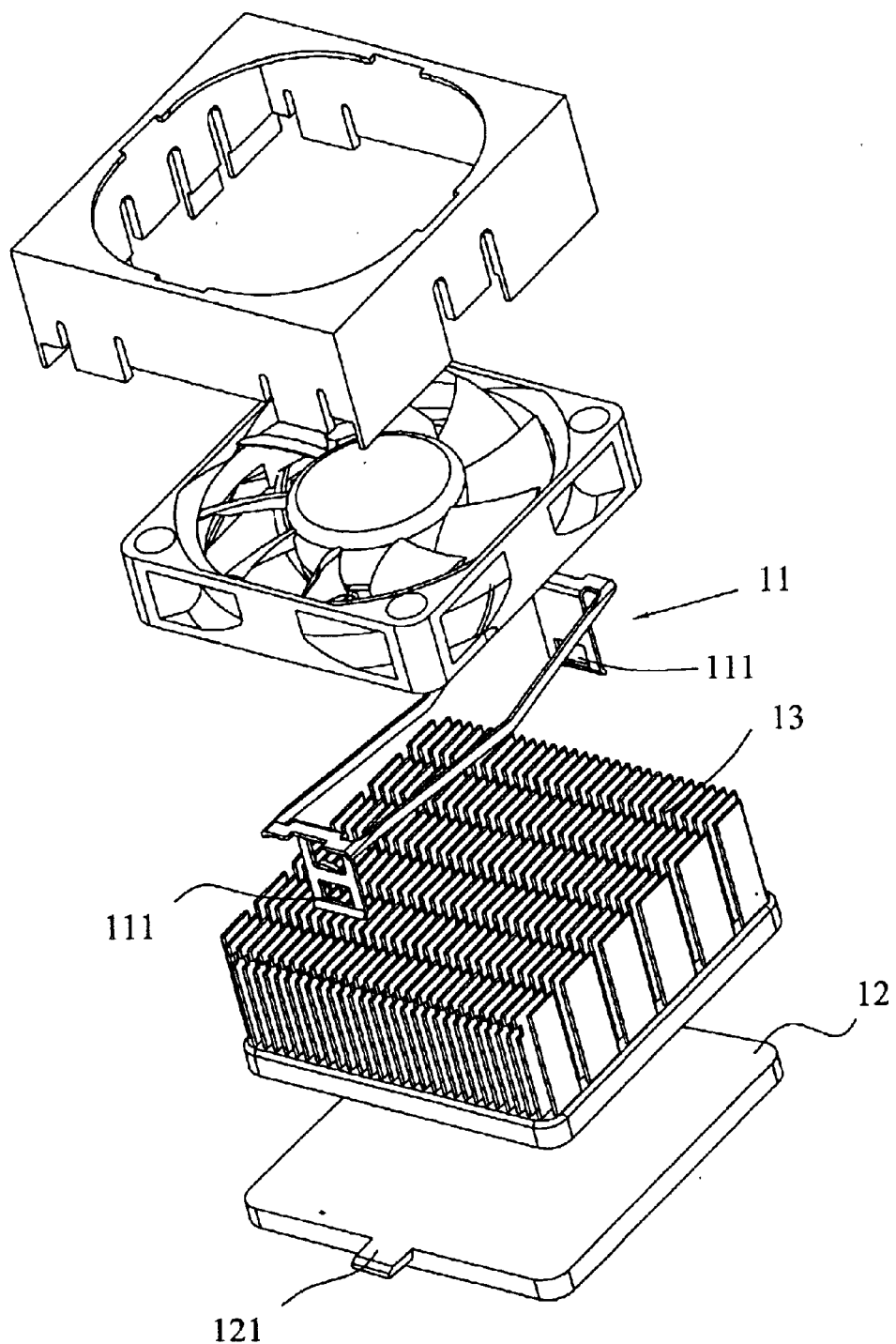
FIG. 1A is an exploded view of a heat-dissipating assembly for a CPU of a conventional computer.
Figure 1B:
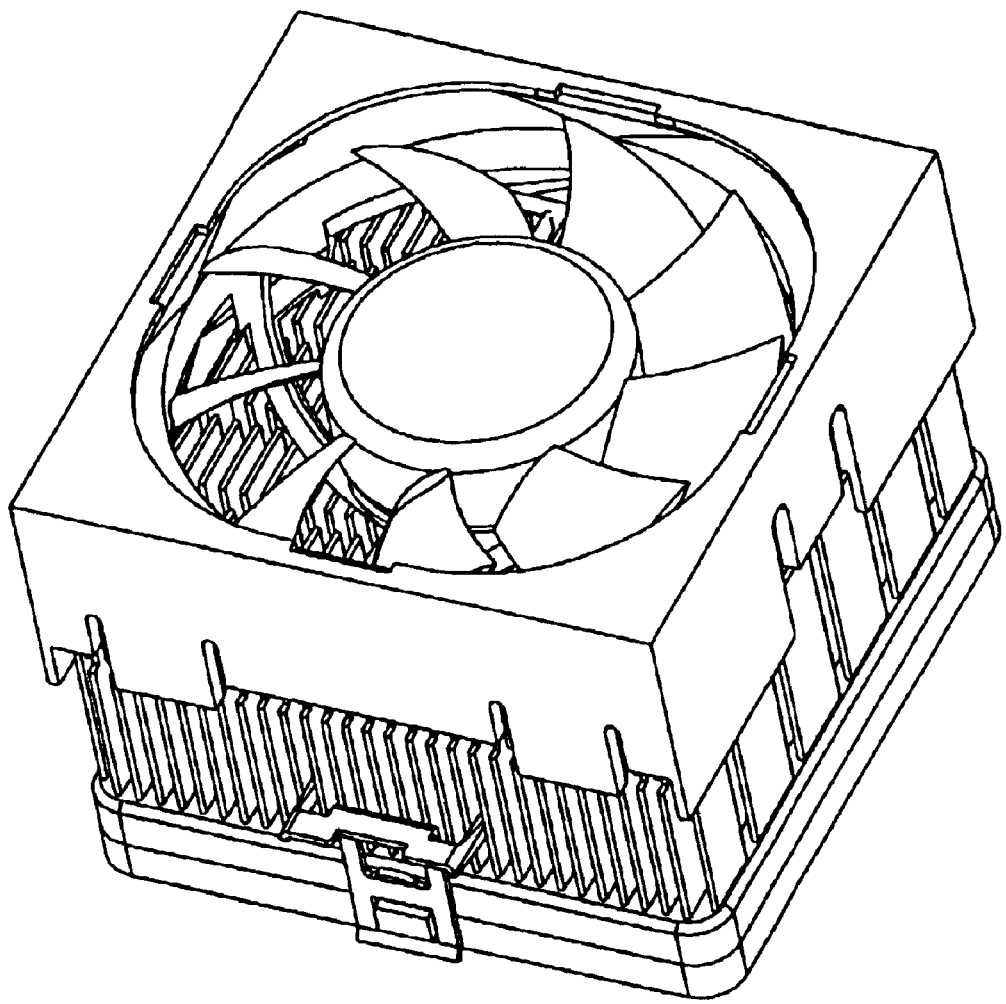
FIG. 1B is an assembly perspective view of the dissipating fastener shown in FIG. 1A.
Figure 2A:
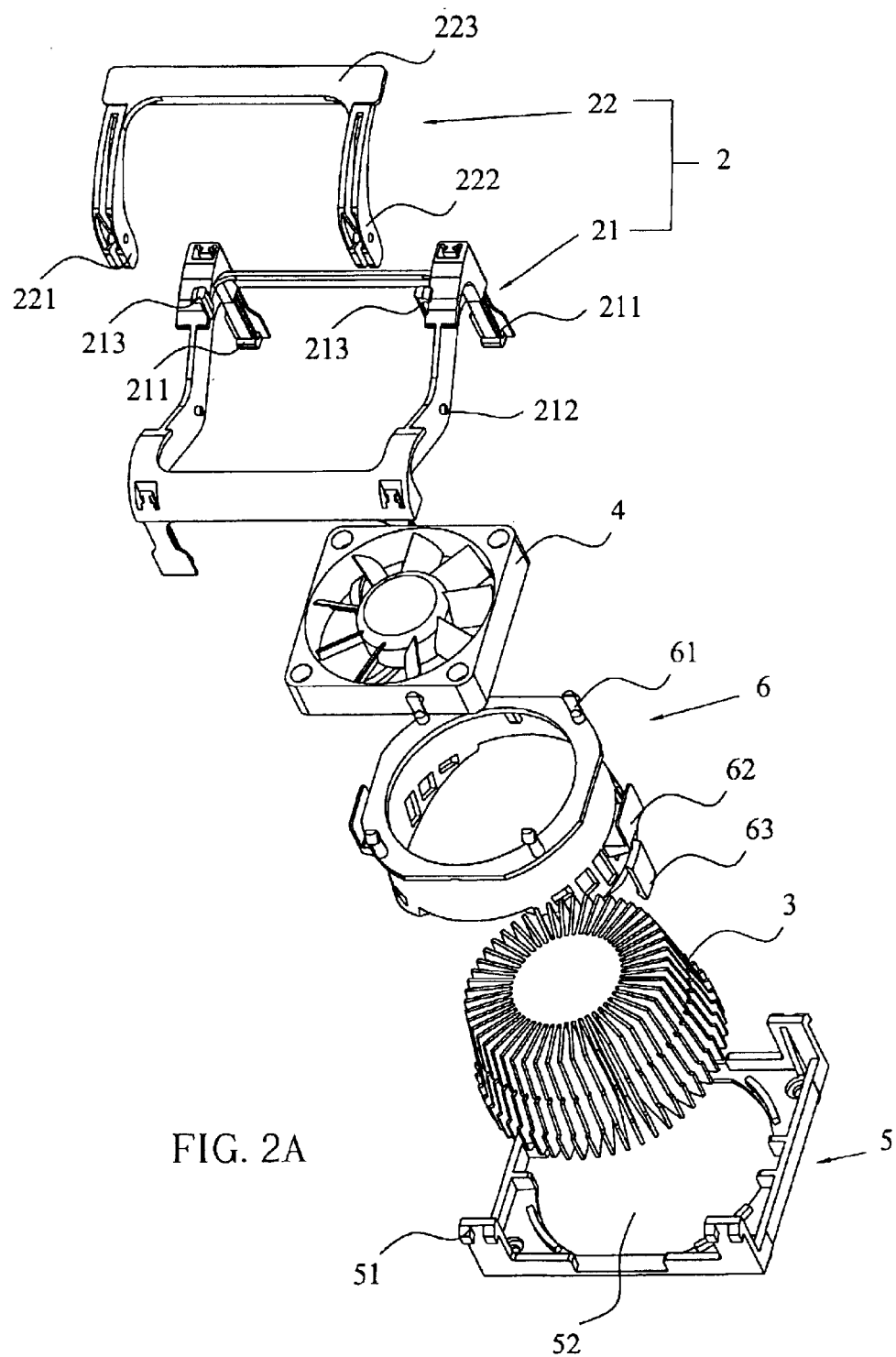
FIG. 2A is an exploded view of a heat-dissipating assembly of a preferred embodiment of the invention.
Figure 2B:
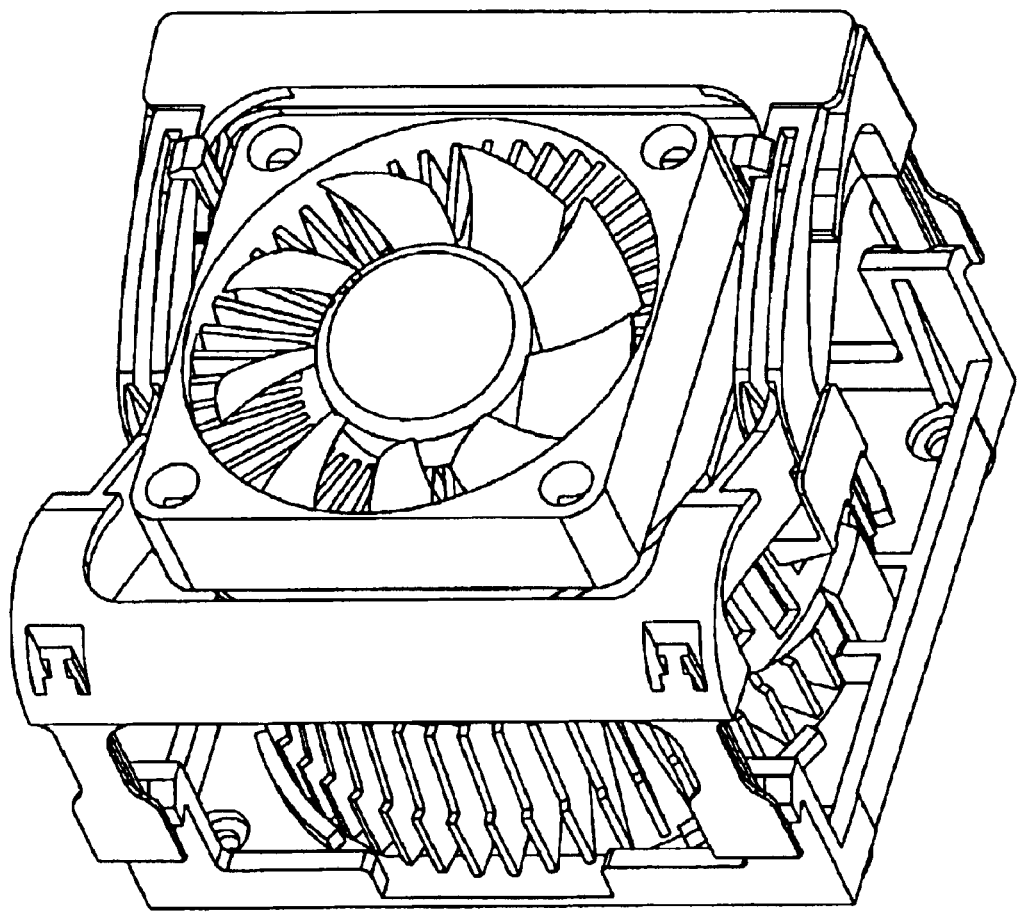
FIG. 2B is a perspective view of the heat-dissipating assembly shown in FIG. 2A after being assembled.

Referring to FIG. 2A, it is an exploded view of a heat-dissipating assembly of a preferred embodiment of the invention. In the embodiment, a heating element (not shown) such as a CPU or an integrated circuit, a heat sink 3 composed of a plurality of fins, a fan-mounting seat 6 and a fan 4 are secured to a socket 5 by a securing device 2, which construct the assembly as shown in FIG. 2B.

Figure 2C:
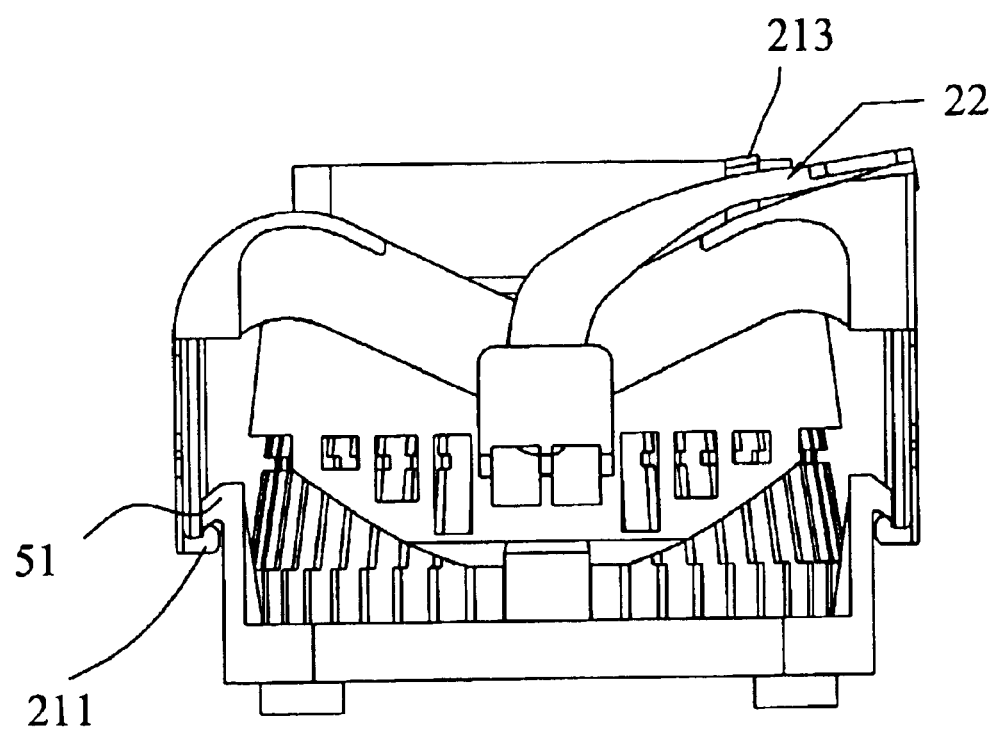
FIG. 2C is a side view of the heat-dissipating assembly shown in FIG. 2A after being assembled.

The securing device 2 includes a frame body 21 and a wrenching member 22. The frame body 21 has a plurality of lower fasteners 211 extended downward, and the frame body 21 is fastened to the socket 5 by the lower fasteners 211. The wrenching member 22 is pivotally coupled to the frame body 21. As shown in FIG. 2C, the lower fastener 211 has an L-shaped engaging hook, which is engaged with an inverted-L-shaped hook 51 on the socket 5. Or, the lower fastener 211 of the frame body 21 may have a retaining hole, which is engaged with an inverted hook on the socket. Preferably, the plurality of lower fasteners 211 is integrally formed with the frame body 21 so as to increase its strength, and both can be made of plastic or metal.

The wrenching member 22 includes two pivoting portions 221, 222 and a link 223. Each of the pivoting portions 221, 222 is engaged with each hole 212 on the frame body 21. The link 223 is linked to the two pivoting portions 221 and 222. The link 223 may be integrally formed with the two pivoting portions 221, 222. By thus, it is possible to apply force simultaneously on the two pivoting portions 221, 222, to facilitate assembling process and apply force evenly so as to avoid improper shift. In turn, the heating element (such as a CPU or an IC), which is placed in the opening 52 of the socket 5 and closely contact the bottom of the heat sink 3, is prevented from being damaged due to an uneven external force applied on it. The two pivoting portions 221, 222 and the link 223 may be made of plastic or metal. As shown in FIG. 2A, the holes 212 on the frame body 21 are placed in the center of the frame body 21 so as to be a fulcrum when applying an external force on the wrenching member 22. As shown in FIG. 2C, the side view of the frame body 21 shows a substantially M-shaped structure. Besides that, the holes 212 on the frame body 21 may also be placed at one end of the frame body 21, and the side view of the frame body 21 shows a substantially inverted-U-shaped structure. Alternatively, the frame body 21 can have pivots 212 as fulcrums to be coupled with holes formed on the pivoting portions 221, 222, respectively.

A plurality of engaging hooks 61 on the fan-mounting seat 6 is engaged with holes on the frame of the fan 4 so as to fix the fan 4 on the fan-mounting seat 6. Moreover, the bottom of the fan-mounting seat 6 has an inverted hook 63 to be fastened to the socket 5 for assembling.

When assembling, first, the heating element may be placed into the opening 52 of the socket 5. Next, the heat sink 3, the fan-mounting seat 6, the fan 4 and the securing device 2 are sequentially assembled on the socket 5, wherein the frame body 21 of the securing device 2 has an opening to accommodate the fan 4. In addition, the fan-mounting seat 6 has a plurality of stoppers 62 extending out from the sides of it. When applying an external force on the wrenching member 22 in one direction, the wrenching member 22 will generate a downward force applied on the stoppers 62, making the heating element closely contact the bottom of the heat sink 3. In addition, the frame body 21 has a plurality of upper fasteners 213. When an external force is applied on the wrenching member 22 in one direction, the upper fasteners 213 are fastened to the wrenching member 22 to complete the assembling process. As shown in FIG. 2B, preferably, each of the upper fasteners 213 is, but not limited to, an inverted-L-shaped engaging hook.

In sum, the securing device 2 disclosed by the invention can install the heat-dissipating device 3 on the heating element or on its corresponding mounting seat without any additional tool. In addition, the securing device 2 utilizes a way of securing by applying force in one direction to make the assembling process much easier, and to prevent the surface of the chip from being damaged due to applying an uneven external force on the chip.

Those skilled in the art can make various modifications and changes to the invention without departing from the spirit and scope of the invention as described in the appended claims. Therefore, the scope of the appended claims should be accorded the broadest interpretation so as to encompass all such modifications and changes.

What is claimed is:

1. A securing device for mounting a heat-dissipating device on a socket, comprising:
    a frame body having a plurality of first fasteners and a plurality of second fasteners, the frame body being fastened to the socket by the first fasteners; and
    a wrenching member pivotally coupled to the frame body, wherein when applying an external force on the wrenching member in one direction, the second fasteners are fastened to the wrenching member and the heat-dissipating device can be mounted on the socket.

2. The securing device as claimed in claim 1, wherein each of the first fasteners of the frame body is an L-shaped engaging hook, which can be engaged with an inverted hook on the socket.

3. The securing device as claimed in claim 1, wherein each of the first fasteners of the frame body has a retaining hole, which can be engaged with an inverted hook on the socket.

4. The securing device as claimed in claim 1, wherein the plurality of first fasteners is integrally formed with the frame body.

5. The securing device as claimed in claim 4, wherein the frame body and the plurality of first fasteners are made of plastic or metal.

6. The securing device as claimed in claim 1, wherein the wrenching member comprises:
    a pivoting portion, which is engaged with the frame body for being a fulcrum when applying an external force on the wrenching member; and
    a link coupled to the pivoting portion.

7. The securing device as claimed in claim 6, wherein the link is integrally formed with the pivoting portion.

8. The securing device as claimed in claim 6, wherein the pivoting portion and the link are made of plastic or metal.

9. The securing device as claimed in claim 6, wherein the pivoting portion is engaged with the frame body at one side of or in the center of the frame body.

10. The securing device as claimed in claim 1, wherein the frame body has an opening for accommodating the heat-dissipating device.

11. The securing device as claimed in claim 1, wherein the frame body has a cross-sectionally modified M-shaped or inverted-U-shaped structure.

12. The securing device as claimed in claim 1, wherein each of the second fasteners is an inverted-L-shaped engaging hook.

13. A heat-dissipating assembly for dissipating heat generated by a heating element, comprising:
    a socket for accommodating the heating element;
    at least one heat-dissipating device, which is mounted on the socket and includes a fan and a heat sink;
    a fan-mounting seat that is fastened to the socket so as to fix the fan on the fan-mounting seat; and
    a securing device having:
    a frame body having a plurality of first fasteners, the frame body being fastened to the socket by the first fasteners; and
    a wrenching member pivotally coupled to the frame body, wherein when applying an external force on the wrenching member in one direction, the heat-dissipating device can be fixed on the socket.

14. The heat-dissipating assembly as claimed in claim 13, wherein the fan-mounting seat has a plurality of stoppers; when applying an external force on the wrenching member in one direction, the wrenching member generates a downward force applying on the stoppers, making the heating element closely contact the bottom of the heat sink.

15. The heat-dissipating assembly as claimed in claim 13, wherein the wrenching member comprises:
    a pivoting portion which is engaged with the frame body for being a fulcrum when applying an external force the wrenching member; and
    a link coupled to the pivoting portion.

16. The heat-dissipating assembly as claimed in claim 13, wherein the frame body further comprises a plurality of second fasteners, which are fastened to the wrenching member when an external force is applied on the wrenching member in one direction.

17. The heat-dissipating assembly as claimed in claim 13, wherein the socket has an opening for accommodating the heat-dissipating device.

18. A securing device for mounting a heat-dissipating device on a socket, comprising:

a frame body having a plurality of first fasteners, wherein each of the first fasteners is an L-shaped engaging hook, which can be engaged with an inverted hook on the socket so as to fasten the frame body to the socket; and a wrenching member pivotally coupled to the frame body, wherein when applying an external force on the wrenching member in one direction, the heat-dissipating device can be mounted on the socket.

* * * * *